US006567304B1

(12) United States Patent
Kleveland (10) Patent No.: US 6,567,304 B1
(45) Date of Patent: May 20, 2003

(54) MEMORY DEVICE AND METHOD FOR RELIABLY READING MULTI-BIT DATA FROM A WRITE-MANY MEMORY CELL (75) Inventor: Bendik Kleveland, Santa Clara, CA (US)

(73) Assignee: Matrix Semiconductor, INC, Santa Clara, CA (US)

( * ) Notice: Subject to any disclaimer, the term of this patent is extended or adjusted under 35 U.S.C. 154(b) by 0 days.

(21) Appl. No.: 10/144,451

(22) Filed: May 9, 2002

(51) Int. Cl.$^7$ .......................... G11C 16/04; G11C 16/06
(52) U.S. Cl. ........................... 365/185.03; 365/185.21
(58) Field of Search ..................... 365/185.03, 185.21, 365/185.33

(56) References Cited

U.S. PATENT DOCUMENTS

| | | | |
|---|---|---|---|
| 5,153,462 A | 10/1992 | Agrawal et al. | |
| 5,264,740 A | 11/1993 | Wright | |
| 5,414,829 A | 5/1995 | Fandrich et al. | |
| 6,034,882 A | 3/2000 | Johnson et al. | |
| 6,134,141 A | 10/2000 | Wong | |
| 6,151,246 A | 11/2000 | So et al. | |
| 6,181,603 B1 | 1/2001 | Jyouno et al. | |
| 6,219,282 B1 | 4/2001 | Tanaka | |
| 6,222,762 B1 | 4/2001 | Guterman et al. | |
| 6,236,587 B1 | 5/2001 | Gudesen et al. | |
| 6,278,633 B1 * | 8/2001 | Wong et al. ............ | 365/185.03 |
| 6,363,008 B1 | 3/2002 | Wong | |
| 6,376,282 B1 | 4/2002 | Corisis | |
| 6,376,284 B1 | 4/2002 | Gonzalez et al. | |

OTHER PUBLICATIONS

"Intel StrataFlash™ Memory Technology Development and Implementation," Fazio et al., Intel Technology Journal, 13 pages (Q4'1997).

"A 125mm² 1Gb NAND Flash Memory with 10MB/s Program Throughput," Nakamura et al., ISSCC 2002/Session 6/SRAM and Non–Volatile Memories/6.4, 2002 IEEE International Solid–State Circuits Conference, Digest of Technical Papers, pp. 106–107 (2002).

"On the Go With Sonos," White et al., Circuits & Devices, pp. 22–31 (Jul. 2000).

"NROM: A Novel Localized Trapping, 2–Bit Nonvolatile Memory Cell," Eitan et al., IEEE Electron Device Letters, vol. 21, No. 11, pp. 543–545 (Nov. 2000).

"A 512Mb NROM Flash Data Storage Memory with 8MB/s Data Rate," Maayan et al., ISSCC 2002/Session 6/SRAM and Non–Volatile Memories/6.1, 2002 IEEE International Solid–State Circuits Conference, Digest of Technical Papers, pp. 100–101 (2002).

(List continued on next page.)

Primary Examiner—Son Mai
(74) Attorney, Agent, or Firm—Brinks Hofer Gilson & Lione (57) ABSTRACT

The preferred embodiments described herein provide a memory device and method for reliably reading multi-bit data from a write-many memory cell. In one preferred embodiment, a non-volatile, write-many memory cell operative to store multiple bits is provided, and the number of program/erase cycles to the write-many memory cell is limited. Limiting the number of program/erase cycles increases the probability that multi-bit data will be correctly read from the memory cell. Other preferred embodiments are provided, and each of the preferred embodiments can be used alone or in combination with one another.

20 Claims, 5 Drawing Sheets

OTHER PUBLICATIONS

"Ovonic Unified Memory—A High-Performance Nonvolatile Memory Technology for Stand-Alone Memory and Embedded Applications," Gill et al., ISSCC 2002/Session 12/TD Digital Directions/12.4, 2002 IEEE International Solid-State Circuits Conference, Digest of Technical Papers, pp. 202–203 (2002).

"0.13 μm Metal-Oxide-Nitride-Oxide-Semiconductor Single Transistor Memory Cell with Separated Source Line," Fujiwara et al., Jpn. J. Appl. Phys. vol. 39, pp. 417–423, Part 1, No. 2A (Feb. 2000).

"Three-Dimensional Memory Array and Method of Fabrication," U.S. patent application Ser. No. 09/560,626, filing date Apr. 28, 2000, inventor: N. Johan Knall.

"Digital Memory Method and System for Storing Multiple-Bit Digital Data," U.S. patent application Ser. No. 09/932,701, filing date Aug. 17, 2001, inventors: Michael A. Vyvoda and N. Johan Knall.

"Write-Many Memory Device and Method for Limiting a Number of Writes to the Write-Many Device," U.S. patent application Ser. No. 09/972,787, filing date Oct. 5, 2001, inventors: David R. Friedman and J. James Tringali.

"64M × 8 Bit NAND Flash Memory," Samsung Electronics (Oct. 27, 2000).

"How Flash Memory Works," wysiwyg://8/http://www.howstuffworks.com/flash-memory,htm?printable=1, 5 pages (1998).

"Datalight FlashFX™ 4.06 User's Guide," p. 11 (Aug. 2000).

"How Does TrueFFS® manage Wear Leveling?," http://www.m-sys.com/content/information/calcInfo.asp, 2 pages (printed Oct. 5, 2001).

* cited by examiner

Fig. 10A
virgin

Fig. 10B
Prog 10

Fig. 10C
Prog 01

Fig. 10D
Prog 00

Fig. 10E
Erase 11

US 6,567,304 B1

MEMORY DEVICE AND METHOD FOR RELIABLY READING MULTI-BIT DATA FROM A WRITE-MANY MEMORY CELL

BACKGROUND

Memory cells are often characterized as being either write-once or write-many. With a write-once memory cell, an unprogrammed digital state of the memory cell (e.g., logic 1) cannot be restored once it has been switched to a programmed digital state (e.g., logic 0). In contrast, a write-many memory cell (such as a Flash memory cell) allows a user to perform multiple program/erase cycles to the memory cell. While write-many memory cells typically store a single bit of data (representing either a logic 0 or a logic 1), some write-many memory cells can store several bits of data per cell. See, for example, U.S. Pat. No. 6,181,603. Storing multiple bits in a memory cell increases the number of logic states that can be represented by the cell. For example, storing two bits per cell increases the number of logic states that can be stored in a memory cell from two (0 or 1) to four (00, 01, 10, or 11). However, repeated program/erase cycles to the memory cell can make it difficult to reliably read multi-bit data from the memory cell. The high-voltage program/erase disturb of a program/erase cycle can degrade the charge storage device, which decreases the noise margin between logic states stored in the memory cells, making it more difficult or impossible to distinguish one logic level from another.

SUMMARY

The present invention is defined by the following claims, and nothing in this section should be taken as a limitation on those claims.

By way of introduction, the preferred embodiments described below provide a memory device and method for reliably reading multi-bit data from a write-many memory cell. In one preferred embodiment, a non-volatile, write-many memory cell operative to store multiple bits is provided, and the number of program/erase cycles to the write-many memory cell is limited. Limiting the number of program/erase cycles increases the probability that multi-bit data will be correctly read from the memory cell. Other preferred embodiments are provided, and each of the preferred embodiments can be used alone or in combination with one another.

The preferred embodiments will now be described with reference to the attached drawings.

DETAILED DESCRIPTION OF THE PRESENTLY PREFERRED EMBODIMENTS

By way of introduction, the preferred embodiments described below relate to nonvolatile, write-many memory cells. With these preferred embodiments, the number of program/erase cycles to a write-many memory cell is limited to increase the probability that multi-bit data will be correctly read from the memory cell. Whereas the prior art places a priority on the number of program/erase cycles that can be performed on a write-many memory cell, these preferred embodiments place a priority on the number of bits that can be stored in and correctly read from a write-many memory cell. Several preferred embodiments are disclosed, and each of these preferred embodiments can be used alone or in combination with one another.

Figure 1A:
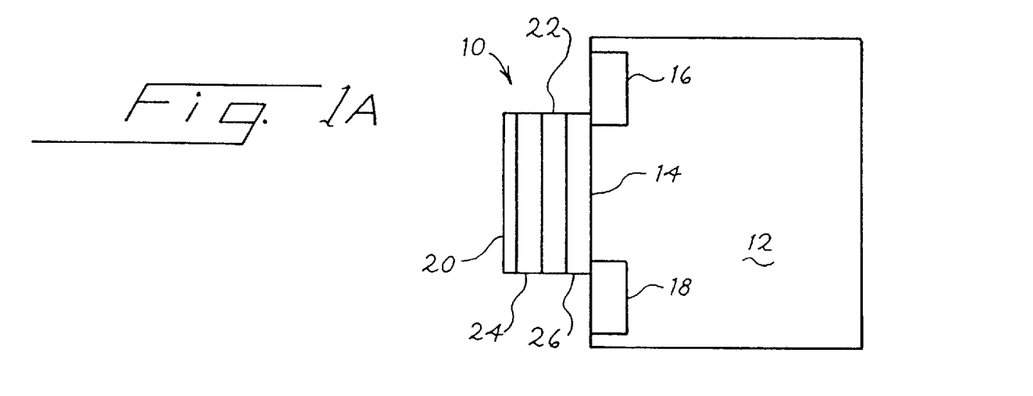
FIG. 1A is an illustration of a write-many memory cell that can be used with the presently preferred embodiments.
Figure 1B:
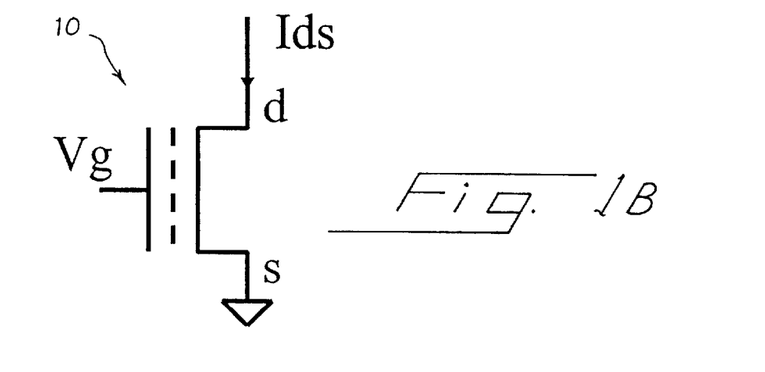
FIG. 1B is a schematic of the write-many memory cell of FIG. 1A.
Figure 2A:
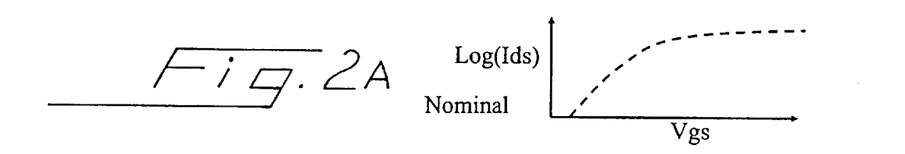
FIG. 2A is a graph of current-voltage characteristics of an unprogrammed write-many memory cell.
Figure 2B:
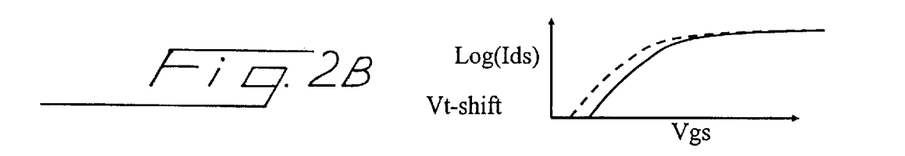
FIGS. 2B and 2C are graphs of current-voltage characteristics showing changes with respect to the graph shown in FIG. 2A.
Figure 2C:
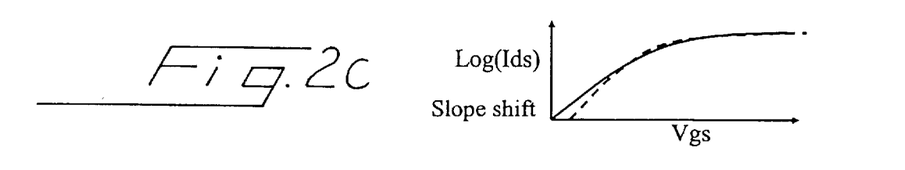

Turning now to the drawings, FIG. 1A is an illustration of a write-many memory cell 10, which can be, for example, a transistor or Flash/SONOS memory cell. The write-many memory cell 10 comprises a substrate 12 having a surface 14, a drain 16, a source 18, and a gate 20. A charge storage element 22 is disposed between two dielectric elements 24, 26 between the gate 20 and the surface 14. A schematic of the write-many memory cell 10 is shown in FIG. 1B. The current-voltage ("I-V") characteristics of an unprogrammed memory cell are shown in FIGS. 2A–2C. As the voltage at the gate is increased, the current through the drain-source increases. The current is an exponential function of gate voltage at small gate voltages (notice logarithmic current versus voltage) and a square or linear function of gate voltage depending on the gate and drain biases at high gate voltages. The nominal I-V characteristics in FIG. 2A may change due to random defects in the gate dielectric or at the surface of the device. Two common effects on the I-V characteristics are illustrated in FIGS. 2B and 2C. In FIG. 2B, defects such as trapped charges in the oxide or surface charges shift the threshold voltage of the device, such that a different Vgs bias is required to achieve the same Ids current. In FIG. 2C, defects cause a change in the sub-threshold slope. Unprogrammed devices will, in general, have a combination of these effects, such that no two devices are exactly the same. As the device is programmed and erased, new surface states and trapped charges in the dielectric as well as other defects may occur, resulting in a larger spread of Vt-shift and slope shift over time.

Figure 3:
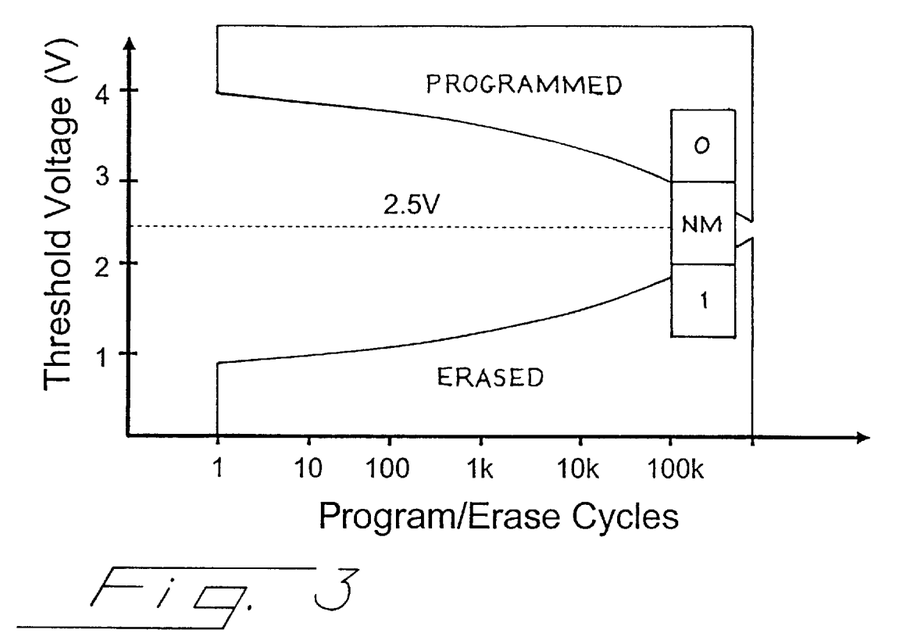
FIG. 3 is a graph of threshold voltage versus program/erase cycles.
Figure 4:
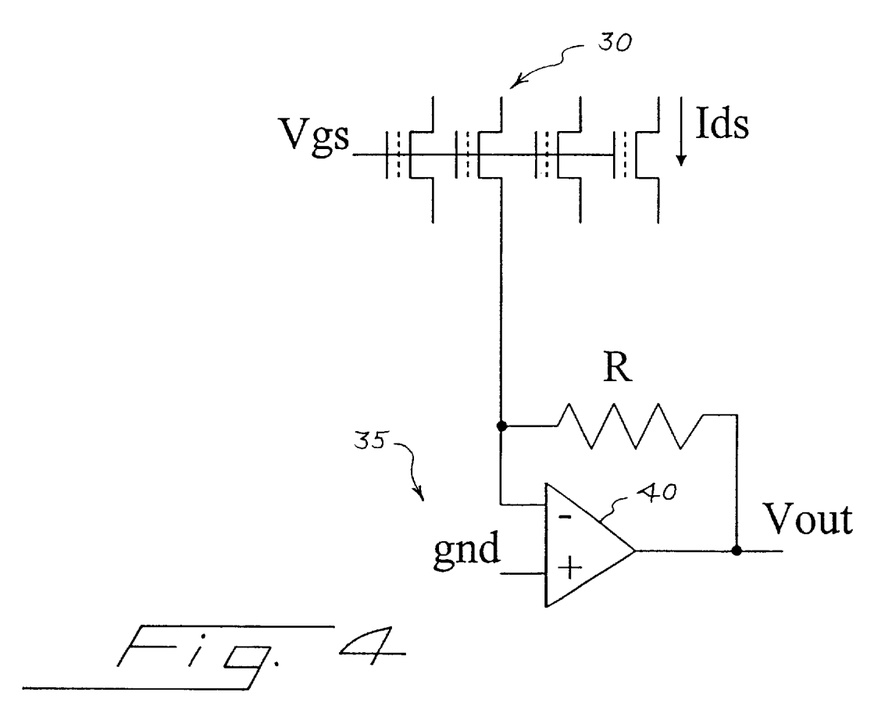
FIG. 4 is a diagram of a write-many memory cell and reading circuitry.

The change in the current-voltage characteristics of a write-many memory cell may not have a deleterious effect if the memory cell is operative to store only a single bit of digital data. Consider, for example, a write-many memory cell 30 (see FIG. 4) whose threshold voltage versus program/ erase cycle characteristics are as shown in FIG. 3. FIG. 4 shows the reading circuitry 35 (an op amp 40 and resistor R) that can be used to read the value stored in the write-many memory cell 30. To read the memory cell 30, a threshold voltage of 2.5V is applied to the gate of the memory cell 30. If the current through the drain-source (indicated by the absolute value of Vout/R) is larger than a reference/comparison current, the memory cell is read as storing a 1. Otherwise, the memory cell is read as storing a 0.

As shown in FIG. 3, there is a large noise margin between the logic 1 and 0 states after one program/erase cycle. This large threshold difference of a few volts corresponds to orders of magnitude difference in current due to the exponential dependence of current on voltage (as illustrated in FIG. 2A). When a threshold voltage is applied to the memory cell 30 after one program/erase cycle, the current through the drain-source could be, for example, 100 microamps if the memory cell 30 is programmed and in the order of 1 nanoamp if the memory cell 30 is erased. This relative large difference of five orders of magnitude makes it easy for the reading circuitry 35 to distinguish between a logic 0 and a logic 1 when the reference/comparison current is about 1 microamp. As the number of program/erase cycles increases, the noise margin between the logic 1 state and the logic 0 state decreases. After 10,000 cycles, the noise margin may still be sufficient for the reading circuitry 35 to distinguish between the logic 1 and logic 0 states. However, as the noise margin decreases further, the reading circuitry 35 may not be able to determine whether the current through the drain-source is larger than the reference/comparison current. For example, after 1,000,000 program/erase cycles, the current through the drain-source could be reduced to 10 microamps when the memory cell 30 is programmed and increased to 7 microamps when the memory cell is erased. A 3 microamp difference may be too small for the reading circuitry 35 to distinguish, resulting in a bit error.

Figure 5A:
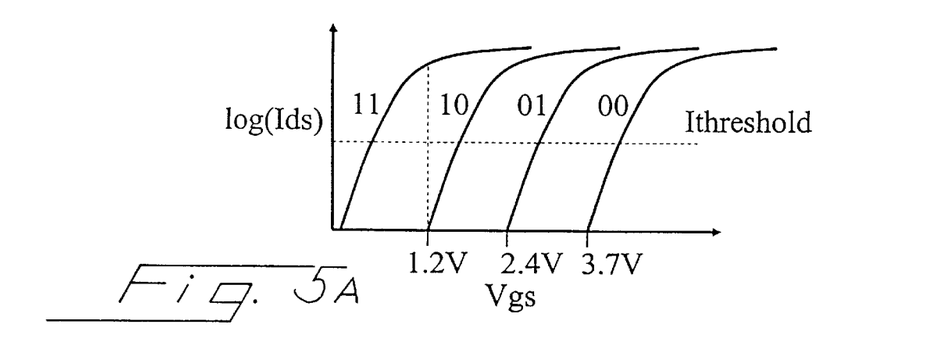
FIG. 5A is a graph of current-voltage characteristics of a write-many memory cell.

When the memory cell is used to store multiple-bits, the effect of a smaller noise margin is even more dramatic. Consider a write-many memory cell that that can be programmed to store two-bits and whose current-voltage characteristics are as shown in FIG. 5A. The unprogrammed digital state of this memory cell is logic level 11. Accordingly, before the memory cell is programmed, it will have a current-voltage characteristic shown by the "11" curve. To program the memory cell, a high voltage is simultaneously applied to the drain and gate for a certain time. The most common method of programming is with hot electron injection into the oxide or gate electrode. This will shift the threshold up towards the next level (10). When trying to program the memory cell to store a logic level (e.g., 10), it is preferred not to program too far so that this level is confused with the next level (e.g., 01). Accordingly, it is preferred to first "under program" the memory cell. After programming a pulse and knowing that the programming increased the threshold voltage, but not enough to achieve the next logic level, a new pulse is applied that is shorter or has lower voltage to ensure that the memory cell is not over programmed. This process can be repeated with pulses that are shorter and shorter until the logic level is close enough to the desired logic level (e.g., 10). This way of slowing down programming as you get closer to the target avoids over programming of the memory cell, which is generally costly since the erase is usually per block (large number of bits) which takes a long time. This programming technique is preferred for memory cells that operate with standard Flash block erase technologies. However, an alternate way of programming can be used if each memory cell can individually be programmed and erased. In this situation, one can start with a longer pulse or higher voltage and maybe on average get closer to the target logic level. If the memory cell is over programmed, one can simply erase for a short time and get even closer for each program or erase.

Regardless of how the memory cell is programmed, the memory cell can be read by applying a voltage to the gate of the memory cell, measuring the current through the drain-source, and comparing the measured current to a reference/comparison current. If the measured current is greater than the reference/comparison current, the memory cell stores the logic state corresponding to the applied voltage. If not, the voltage is increased, and the measuring/comparing steps are repeated. Consider, for example, the memory cell whose current-voltage characteristics are as shown in FIG. 5A. If the memory cell is in an unprogrammed state (logic level 11), when a voltage corresponding to that logic level (Vgs=1.2V) is applied to the gate of the memory cell, the current through the drain-source (Ids) is larger than a reference/comparison current (threshold). This indicates that the memory cell stores logic level 11. However, if the memory cell has been programmed to either 10, 01, or 00, the measured current at a gate bias of 1.2V would be less than the reference current. To determine which logic level is stored in the memory cell, the gate bias is increased to the next voltage level (2.4V), and the current through the drain-source (Ids) is again measured. If the current is larger than the reference current, the level is determined to be 10. If the current is still lower than the reference current, the level is either 01 or 00. To determine which of these two logic levels is stored in the memory cell, the gate bias is increased to 3.7V, and the current is again measured. If the current is larger than the reference current, the level is 01; otherwise, the level is determined to be 00. Thus, with a minimum of one measurement and a maximum of three measurements, one can determine which one of the four levels (11, 10, 01, and 00) is stored in the memory cell.

Figure 5B:
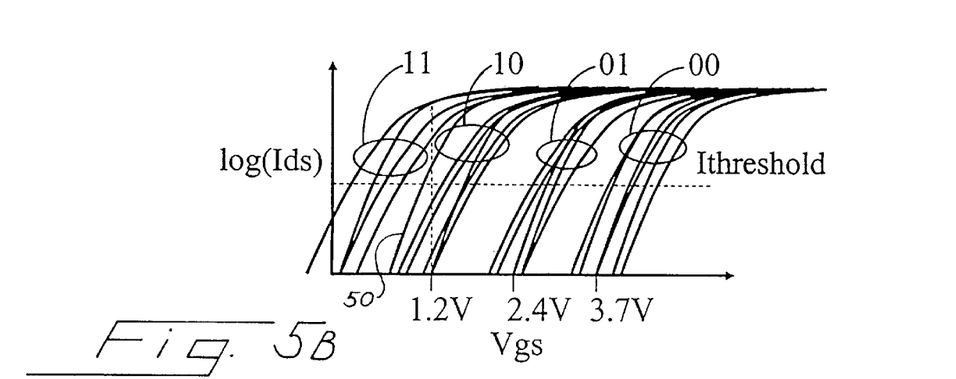
FIG. 5B is a graph of current-voltage characteristics of a write-many memory cell after several program/erase cycles.

After programming and erasing multiple times, however, the memory cell threshold distribution generally widens due to new surface states and trapped charges in the dielectric. This is illustrated in FIG. 5B, where several curves having slightly different thresholds and/or slopes are shown for each of the four logic levels. This change in the current-voltage curve can result in an incorrect reading of a memory cell. Consider, for example, a memory cell storing logic level 10. After several program/erase cycles, its current-voltage characteristics will be represented by curve 50, which crosses over into the logic 11 level. Accordingly, when a voltage corresponding to logic level 11 (1.2V) is applied to the gate of the memory cell, the drain-source current will be greater than the threshold current even though the memory cell stores 10 and not 11. As a result, the reading circuitry will incorrectly determine that the memory cell stores logic level 11 instead of logic level 10, and a bit error will occur.

Figure 6:
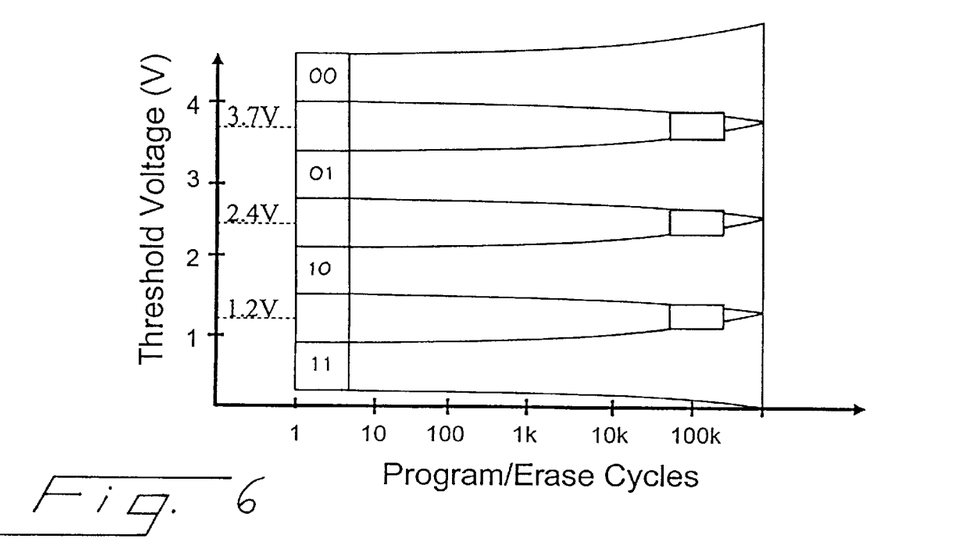
FIG. 6 is a graph of threshold voltage versus program/erase cycles for a write-many memory cell storing two-bits.
Figure 7:
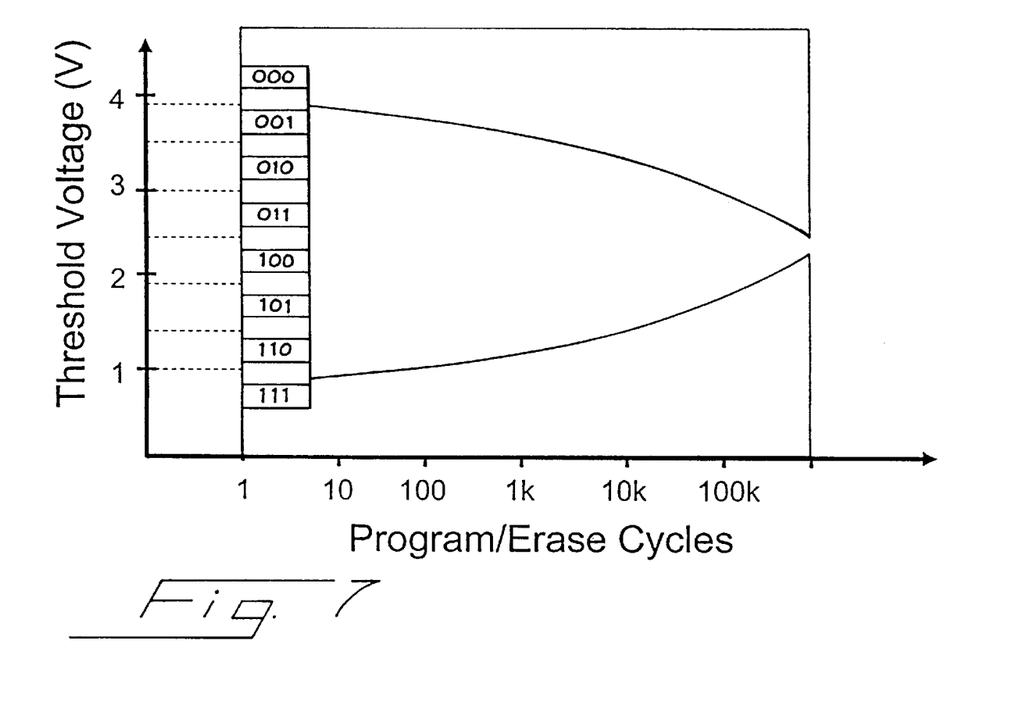
FIG. 7 is a graph of threshold voltage versus program/erase cycles for a write-many memory cell storing three-bits.

Another way of characterizing this effect is to say that the noise margin between logic levels decreases as a number of program/erase cycles increases. This is schematically shown in FIG. 6. For about the first 100 program/erase cycles, the noise margin between logic levels is relatively constant. However, after about 100 program/erase cycles, the noise margin between logic levels decreases and eventually disappears at 1,000,000 program/erase cycles. Depending on the reading circuitry used, logic levels may be indistinguishable at 100,000 program/erase cycles (as shown by the boxes in FIG. 6) or at even fewer program/erase cycles (e.g., 10,000 or 1,000). This effect is even more exaggerated when the memory cell stores more than two bits since a smaller noise margin may make it impossible to distinguish between logic levels after even only a few program/erase cycles. This is shown schematically in FIG. 7, where after ten program/erase cycles, the noise margin has decreased to the point where it is no longer possible to distinguish logic level 000 from logic level 001 and logic level 111 from logic level 110.

Figure 8A:
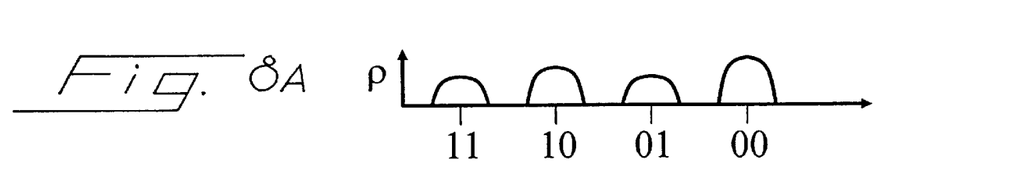
FIGS. 8A–8C are probability density sketches after one write, 100,000 program/erase cycles, and 1,000,000 program/erase cycles, respectively.
Figure 8B:
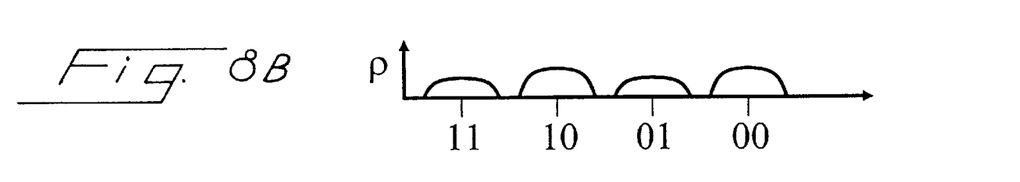
Figure 8C:
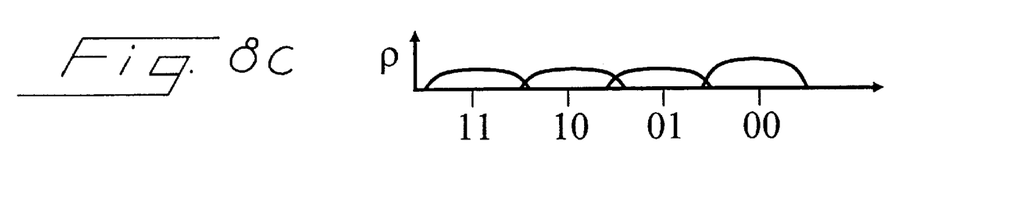

This phenomenon can also be explained in terms of probability densities. FIG. 8A shows a probability density sketch of a write-many memory cell storing two bits after the memory cell is written into once. None of the distributions overlap one another, and each of the logic levels is clearly distinguishable. As shown in FIG. 8B, after 100,000 program/erase cycles, the distributions at each logic level widen due to the individual threshold shifts and sub-threshold slope changes as well as other defects. A finite separation is still shown between the logic levels, and if the reading circuits used to detect the levels are accurate enough (i.e., the noise margin is large enough), it still may be possible to reliably read the multiple bits from the memory cell. However, after 1,000,000 program/erase cycles, the distributions overlap each other (see FIG. 8C), and it is not possible to reliably distinguish one level from the next.

To help maintain the ability to distinguish among the logic levels, it is preferred that the number of program/erase cycles to the memory cell be limited to maintain an adequate noise margin between logic levels. In one preferred embodiment, a desired number of bits to be read from the write-many memory cell is determined by the manufacturer of the memory cell. As used herein, a "manufacturer" refers to any party who handles the memory cell before it is sold or distributed to an end user (e.g., a consumer). A "manufacturer" can include a party involved in the manufacturing, assembly, packaging, sale, or distribution of the memory cell. The number of program/erase cycles to that memory cell is limited based on this desired number of bits. For example, to maximize the probability that two bits of data will be correctly read from a memory cell with the characteristics shown in FIG. 6, the number of program/erase cycles can be limited to 1, rending the write-many memory cell as a write-once memory cell. Alternatively, the number of program/erase cycles can be limited to 10, 100, 1,000, or any other number of program/erase cycles below the number that causes bit errors.

The number of program/erase cycles to a memory cell can be limited in any suitable manner. For example, in one preferred embodiment (shown in FIG. 9A), the number of program/erase cycles is limited by a controller 60 in a memory device 65 containing a memory array 70 of field-programmable, non-volatile, write-many memory cells. The memory device 65 comprises a housing that protects the internal components of the device 65 (e.g., the controller 60 and the memory array 70) and forms a compact, modular, handheld unit (such as a card or a stick) that is easily transported and easily inserted into and removed from a host device 75 having a mating connector. The host device 75 can take the form, for example, of a consumer electronic device, such as a digital camera, a digital audio recorder/player, a personal digital assistant, a cellular telephone, or a game player.

Figure 9A:
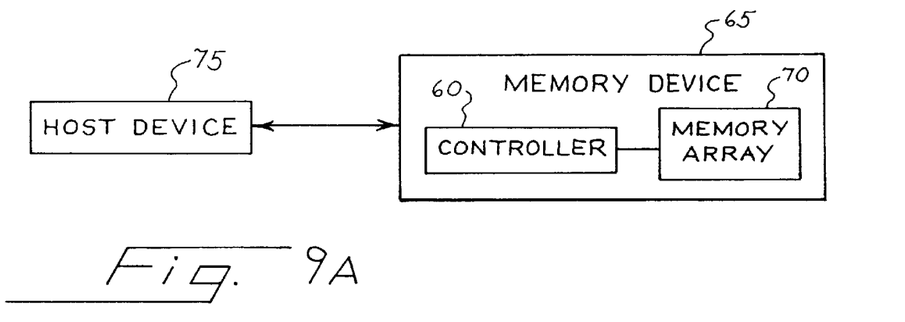
FIG. 9A is a block diagram of a memory device and host device of a preferred embodiment.

In operation, the limit to the number of program/erase cycles to the memory cells in the memory array 70 is stored in the controller 60 of the memory device 65. When the host device 75 attempts to perform a program and/or erase operation to memory cells, the controller 60 determines if that operation would exceed the limit. If the operation would not exceed the limit, the controller 60 allows the operation to take place. If, however, the controller 60 determines that the operation would exceed the limit, the controller 60 prevents the operation from taking place. In this embodiment, the controller 60 is preferably implemented as a hardware component, which can be separate from or combined with other components of the memory device 65.

Figure 9B:
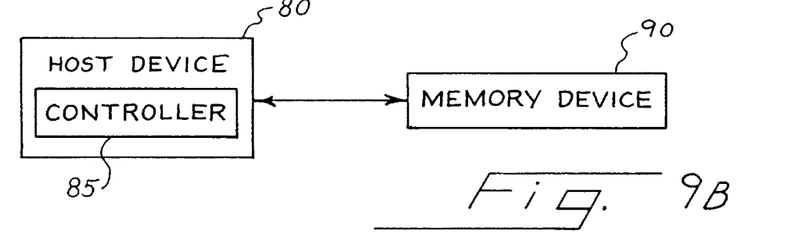
FIG. 9B is a block diagram of a memory device and host device of another preferred embodiment.

In another embodiment, instead of enforcing the program/erase cycle limit at the memory device, the limit is enforced by the host device. This embodiment is illustrated in FIG. 9B. FIG. 9B shows the host device 80 containing a controller 85, which can take the form of a hardware and/or software component and can be separate from or combined with other hardware and/or software components of the host device 80. In operation, the memory device 90 provides the host device 80 with an indication of the program/erase cycle limit. For example, if the limit is one (i.e., the write-many memory cells are rendered write-once), the memory device 90 can be hardwired to provide the host device 80 with a predetermined signal (such as a unique id) when the memory device 90 is connected to the host device 80. The controller 85 will recognize this signal as indicating that the memory device 90 is write once and, accordingly, will allow only a single program and/or erase operation. If the memory device 90 is limited to more than a single program/erase cycle, the memory device 90 can store the program/erase cycle limit in a register, and the controller 85 can be configured to decrease the number stored in the register for each program/erase cycle. This ensures that the proper program/erase cycle limit will be enforced even if the memory device 90 is used at a later time with the same or different host device. U.S. patent application Ser. No. 09/972,787, which is assigned to the assignee of the present invention and is hereby incorporated by reference, describes additional techniques that can be used to limit the number of writes to a write-many memory device. It is important to note that other ways of limiting the number of program/erase cycles to a memory cell can be used, and the following claims should not be read as requiring any specific technique unless expressly recited therein.

Figure 10A:
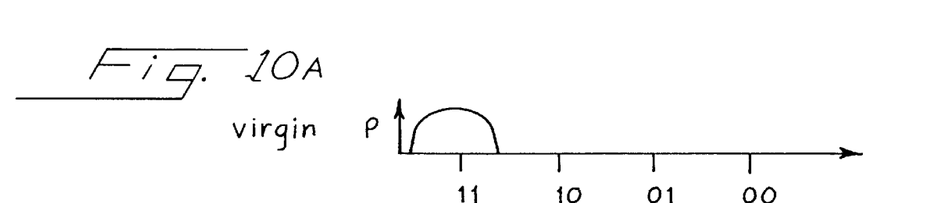
FIGS. 10A–10E are probability density sketches of a write-many memory cell.
Figure 10B:
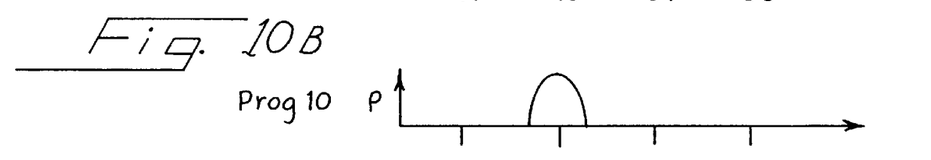
Figure 10C:
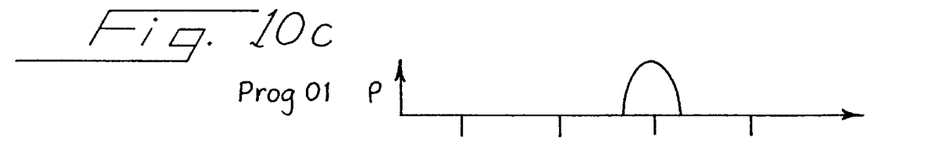
Figure 10D:
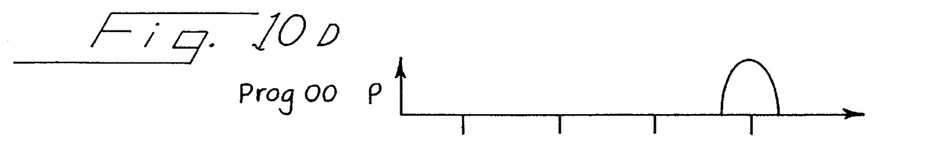
Figure 10E:
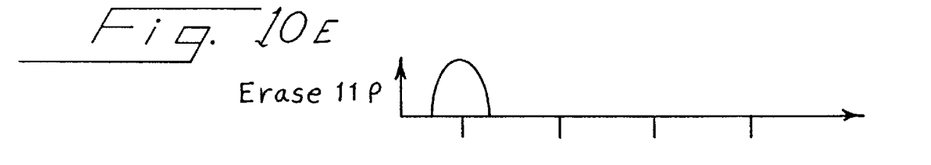

Preferably, the limit on the number of program/erase cycles is set by the manufacturer after testing of the write-many memory cell, which itself involves multiple program/erase cycles. In general, the following steps take place during a testing operation: programming the memory cell, reading the memory cell, verifying that the memory cell stores the programmed bit(s), erasing the memory cell, and verifying that the memory cell has been erased. These steps are repeated for each logic level to be stored in each memory cell. Testing before limiting the number of program/erase cycles improves yield in two ways. First, by testing each memory cell, those memory cells that fail the test can be marked as bad, preventing them from storing data. Second, the program/erase cycle involved in the testing process may provide a tighter probability density at the unprogrammed logic state than that provided by the fabrication process. As shown in FIG. 10A, when a memory cell is fabricated, it is in its virgin, unprogrammed state and has a relatively wide probability density around logic level 11. Depending on the reading circuitry used, this relatively wide probability density can cause the memory cell to mistakenly be read as storing logic level 10 instead of logic level 11. However, when a memory cell is programmed or erased, its probability density may be tighter. This can be seen by comparing the narrower peak shown in FIG. 10E with the wider peak shown in FIG. 10A. Accordingly, a tested memory cell is more likely to be read as storing a 11 than a virgin memory cell.

There are several advantages associated with these preferred embodiments. Limiting the number of program/erase cycles dramatically improves the noise margin to distinguish between logic levels and completely eliminates high-voltage program/erase disturb, which is the main mechanism that degrades the charge storage (oxide/ONO) device. It also significantly reduces the high-voltage write disturb of adjacent cells that may be exposed to a high voltage on the gate only but not the drain. Accordingly, by limiting the number of program/erase cycles to a memory cell, multi-bit data can be reliably read from the memory cell. Additionally, a reduction of disturb will, in general, allow the use of more voltage levels per bit while maintaining the shelf life of the memory device (e.g., instead of storing a single or two bits in a memory cell, one can store several bits, thereby increasing the effective density of the write once product over the capability of the write many technology).

These preferred embodiments also offer an alternative to a traditional write-once memory cell. One disadvantage of a write-once memory cell is that it cannot be tested since the unprogrammed digital state of the memory cell cannot be restored once it has been switched to the programmed digital state. By using these preferred embodiments, a write-many device can be tested and then transformed into a write-once memory device by limiting the number of times the memory cell can be programmed to one. Using a write-many technology to test write/read every single memory cell in a memory device before shipping it as a write-once technology dramatically improves the yield over a traditional write-once memory device. These preferred embodiments also allow a memory device manufacturer to use one basic technology (write-many) for many products (write-many and write-once memory devices) to leverage process development.

There are several alternatives that can be used with these preferred embodiments. For example, a memory device can have some write-many memory cells that have a limited number of program/erase cycles and other write-many memory cells that are not limited. Additionally, the number of program/erase cycles can be limited to the maximum or minimum number of cycles (or some number in between) allowed to reasonably ensure that the memory cell will be read correctly. For example, if a noise margin begins to decrease after 100,000 program/erase cycles, the number of program/erase cycles can be limited to one, 100,000, or some larger number that more closely approaches the probability density overlap.

As used herein, the phrase "program/erase cycle" is intended to broadly refer to any operation(s) (program only, erase only, both program and erase) that makes a memory cell less likely to be read correctly. For example, in memory cells that are not "erased" but are merely re-written with new data, a "program/erase cycle" would comprise a write operation (and not an erase operation). More generally, if the switching of a digital state causes degradation in the memory cell, the program/erase cycle comprises any operation that causes the digital state to be changed, irrespective of whether it is called a program operation or an erase operation. Additionally, it is contemplated that in a memory cell that degrades only with an erase operation (and not with a write operation), the number of program/erase cycles can be limited by limiting only the number of erase operations without placing any limit on the number of write operations.

Any type of write-many technology (existing or later developed) can be used to implement the preferred embodiments described above. Also, write-many memory cells can be organized in any suitable manner (e.g., in a two or three dimensional array). The following documents, which are each incorporated by reference, provide examples of suitable write-many technologies. It is important to note that the following claims should not be read as requiring a specific type of write-many technology unless explicitly recited therein.

U.S. patent application Ser. No. 09/927,648, filed Aug. 13, 2001;

U.S. Pat. No. 6,181,603;

Fazio et al., "Intel StrataFlash™ Memory Technology Development and Implementation," Intel Technology Journal, 13 pages, $4^{th}$ quarter 1997;

Nakamura et al., "A 125 $mm^2$ 1 Gb NAND Flash Memory with 10 MB/s Program Throughput," International Solid-State Circuits Conference, pp. 106–107, 2002;

White et al., "On the Go with SONOS," IEEE Circuit and Devices Magazine, Vol. 16, Issue 4, pp. 22–31, July 2000;

Eitan et al., "NROM: A Novel Localized Trapping, 2-Bit Nonvolatile Memory Cell," IEEE Electron Device Letters, Vol. 21, No. 11, pp. 543–545, November 2000;

Maayan et al, "A 512 Mb NROM Flash Data Storage Memory with 8 MB/s Data Rate," International Solid-State Circuits Conference, pp. 100–101, 2002;

Fujiwara et al., "0.13 um Metal-Oxide-Nitride-Oxide-Semiconductor Single Transistor Memory Cell with Separated Source Line," Jpn. J. Appl. Phys. Vol. 39 (2000) pp. 417–423, February 2000; and Gill et al., "Ovonic Unified Memory—A High-Performance Nonvolatile Memory Technology for Stand-Alone Memory and Embedded Applications," International Solid-State Circuits Conference, pp. 202–203, 2002.

It is intended that the foregoing detailed description be understood as an illustration of selected forms that the invention can take and not as a definition of the invention. It is only the following claims, including all equivalents, that are intended to define the scope of this invention.

What is claimed is:

1. A method allowing multi-bit data to be read from a non-volatile, write-many memory cell, the method comprising:

(a) providing a non-volatile, write-many memory cell;

(b) determining a desired number of bits to be read from the non-volatile, write-many memory cell; and (c) limiting a number of program/erase cycles to the non-volatile, write-many memory cell based on the desired number of bits to be read from the non-volatile, write-many memory cell.

2. The method of claim 1, wherein the number of program/erase cycles is limited to one.

3. The method of claim 1, wherein the number of program/erase cycles is limited after testing of the non-volatile, write-many memory cell.

4. The method of claim 1, wherein the desired number of bits is two.

5. The method of claim 1, wherein the desired number of bits is greater than two.

6. The method of claim 1, wherein the memory cell is part of a memory device, and wherein the number of program/erase cycles is limited by a controller in the memory device.

7. The method of claim 1, wherein the memory cell is part of a memory device connectable to a host device, and wherein the number of program/erase cycles is limited by a controller in the host device.

8. A method allowing multi-bit data to be read from a non-volatile, write-many memory cell, the method comprising:

(a) providing a non-volatile, write-many memory cell operative to store multi-bit data representing one of a plurality of logic levels, wherein a noise margin between logic levels decreases as a number of program/erase cycles to the non-volatile, write-many memory cell increases; and (b) limiting a number of program/erase cycles to the non-volatile, write-many memory cell.

9. The method of claim 8, wherein the number of program/erase cycles is limited to one.

10. The method of claim 8, wherein the number of program/erase cycles is limited after testing of the non-volatile, write-many memory cell.

11. The method of claim 8, wherein the memory cell is operative to store two bits.

12. The method of claim 8, wherein the memory cell is operative to store more than two bits.

13. The method of claim 8, wherein the memory cell is part of a memory device, and wherein the number of program/erase cycles is limited by a controller in the memory device.

14. The method of claim 8, wherein the memory cell is part of a memory device connectable to a host device, and wherein the number of program/erase cycles is limited by a controller in the host device.

15. A memory device comprising:

a modular housing;

a memory array within the modular housing, the memory array comprising a plurality of non-volatile, write-many memory cells, each operative to store multi-bit data representing one of a plurality of logic levels; and means for limiting a number of program/erase cycles to the non-volatile, write-many memory cells.

16. The invention of claim 15, wherein said means limits the number of program/erase cycles to one.

17. The invention of claim 15, wherein said means comprises a controller that prevents a program/erase cycle to the memory cells if the program/erase cycle would exceed a limit on the number of program/erase cycles.

18. The invention of claim 15, wherein said means comprises circuitry operative to provide a host device connected to the memory device with an indication of the limit of program/erase cycles, and wherein a controller in the host device prevents a program/erase cycle if the program/erase cycle would exceed a limit on the number of program/erase cycles.

19. The invention of claim 15, wherein the number of program/erase cycles is limited based on a desired number of bits to be read from each of the non-volatile, write-many memory cells.

20. The invention of claim 15, wherein said means limits the number of program/erase cycles after testing of the non-volatile, write-many memory cells.

* * * * *